United States Patent
Takahashi et al.

(10) Patent No.: US 7,039,889 B2
(45) Date of Patent: May 2, 2006

(54) APPARATUS, METHOD, AND PROGRAM FOR DESIGNING A MASK AND METHOD FOR FABRICATING SEMICONDUCTOR DEVICES

(75) Inventors: Kazuhiko Takahashi, Kawasaki (JP); Masahiko Minemura, Kawasaki (JP); Mitsuo Sakurai, Kawasaki (JP); Kazuya Sugawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/379,904

(22) Filed: Mar. 6, 2003

(65) Prior Publication Data

US 2003/0200523 A1    Oct. 23, 2003

(30) Foreign Application Priority Data

Apr. 19, 2002    (JP)    ............... 2002-117085

(51) Int. Cl.
    *G06F 17/50*    (2006.01)
(52) U.S. Cl. ............... 716/9; 716/20; 716/21
(58) Field of Classification Search ............ 716/19–21; 250/492.3, 492.22; 430/5
    See application file for complete search history.

(56) References Cited

U.S. PATENT DOCUMENTS

| | | | | |
|---|---|---|---|---|
| 4,496,216 A | * | 1/1985 | Cowan | ............... 356/566 |
| 5,448,494 A | * | 9/1995 | Kobayashi et al. | ............ 716/5 |
| 5,774,575 A | * | 6/1998 | Tanaka et al. | ............ 382/149 |
| 5,841,520 A | * | 11/1998 | Taniguchi | ............ 355/53 |
| 6,466,315 B1 | * | 10/2002 | Karpol et al. | ............ 356/237.4 |
| 6,493,063 B1 | * | 12/2002 | Seltmann et al. | ............ 355/53 |
| 6,525,806 B1 | * | 2/2003 | Smith | ............ 355/71 |
| 6,541,784 B1 | * | 4/2003 | Kawano et al. | ............ 250/492.3 |
| 6,559,953 B1 | * | 5/2003 | Davids | ............ 356/521 |
| 6,630,681 B1 | * | 10/2003 | Kojima | ............ 250/492.22 |
| 6,633,408 B1 | * | 10/2003 | Rozzi | ............ 358/1.9 |
| 6,846,595 B1 | * | 1/2005 | Smith | ............ 430/5 |
| 2003/0112421 A1 | * | 6/2003 | Smith | ............ 355/71 |
| 2003/0160980 A1 | * | 8/2003 | Olsson et al. | ............ 358/1.9 |
| 2003/0211400 A1 | * | 11/2003 | Smith | ............ 430/5 |

* cited by examiner

*Primary Examiner*—Thuan V. Do
*Assistant Examiner*—Naum Levin
(74) *Attorney, Agent, or Firm*—Staas & Halsey LLP

(57) ABSTRACT

An apparatus for designing a mask that enables quick mask design. A generation unit generates data regarding a mask pattern formed on a mask from design data regarding an exposure pattern transferred onto a semiconductor substrate. A calculation unit calculates an exposure pattern transferred onto the semiconductor substrate by applying a filter having a predetermined characteristic to the data regarding a mask pattern generated by the generation unit. A correction unit corrects the data regarding a mask pattern generated by the generation unit by comparing the exposure pattern calculated by the calculation unit and the design data.

21 Claims, 16 Drawing Sheets

| 0 | 0 | 0 | 0 | 0 | 0 |
|---|---|---|---|---|---|
| 0 | 1/9 | 2/9 | 2/9 | 1/9 | 0 |
| 0 | 2/9 | 4/9 | 4/9 | 2/9 | 0 |
| 0 | 2/9 | 4/9 | 4/9 | 2/9 | 0 |
| 0 | 1/9 | 2/9 | 2/9 | 1/9 | 0 |
| 0 | 0 | 0 | 0 | 0 | 0 |

FIG. 6

DISTRIBUTION OF LIGHT INTENSITY AFTER FOURIER TRANSFORM

DISTRIBUTION OF LIGHT INTENSITY AFTER APPLICATION OF IMAGE FILTER

DIFFERENCE BETWEEN DISTRIBUTION OF
LIGHT INTENSITY SHOWN IN FIGS. 8 AND 9

APPARATUS, METHOD, AND PROGRAM FOR DESIGNING A MASK AND METHOD FOR FABRICATING SEMICONDUCTOR DEVICES

CROSS-REFERENCE TO RELATED APPLICATIONS

This application is based upon and claims priority of Japanese Patent Application No. 2002-117085, filed on Apr. 19, 2002, the contents being incorporated herein by reference.

BACKGROUND OF THE INVENTION (1) Field of the Invention

This invention relates to an apparatus, method, and program for designing a mask and a method for fabricating semiconductor devices by the use of such a mask and, more particularly, to an apparatus, method, and program for designing a mask in which an exposure pattern or a pattern of physical shape formed on a semiconductor substrate is calculated with a filter and in which a mask is designed on the basis of calculated results and a method for fabricating semiconductor devices by the use of such a mask.

(2) Description of the Related Art

Highly accurate large scale integrated circuit (LSI) patterns which have been used in recent years require minute pattern formation technologies and highly accurate pattern formation technologies. To form minute patterns, that is to say, patterns smaller than or equal to light wavelengths used in exposure systems, phase shifts have been applied. To form highly accurate patterns, optical proximity corrections (OPCs) have been applied.

With an OPC, a correction pattern for mask pattern data is made to optically correct a pattern on a mask (or reticle) and to transfer a desired image onto a wafer. A rule-based method and simulation-based method are widely known as a method for making a correction pattern. The simulation-based method is suitable for highly accurate LSI patterns and it will be necessary in the future to apply the simulation-based method to all LSI chips.

FIG. 16 is a view for describing a way of adding an OPC in a conventional simulation-based method. In FIG. 16, the structure of an exposure system for transferring a pattern formed on a mask 12 onto a wafer 14 in an exposure process is shown in an area enclosed by a dashed line.

As shown in FIG. 16, the exposure system includes a light source 10, an illumination lens 11, the mask 12, and a projection lens 13 and transfers the pattern formed on the mask 12 onto the wafer (semiconductor substrate) 14.

The light source 10 irradiates ultraviolet rays, electron beams, or the like.

The illumination lens 11 makes ultraviolet rays or electron beams irradiated from the light source 10 converge on an area on the mask 12 to be transferred.

The mask 12 is fabricated by forming a light shielding film of chromium corresponding to a circuit pattern on a silica substrate. The mask 12 shuts out or transmits ultraviolet rays or electron beams which passed through the illumination lens 11 according to the circuit pattern.

The projection lens 13 makes light which passed through the mask 12 converge on a predetermined area on the wafer 14.

The wafer 14 is, for example, a silicon wafer coated with photo resist.

Now, a way of adding an OPC in the simulation-based method will be described with reference to FIG. 16.

It is assumed that a mask pattern 12a shown at the top of FIG. 16 is transferred onto the wafer 14. In this case, it is desirable that an exposure pattern 14a transferred onto the wafer 14 should be more similar to the mask pattern 12a. But in reality the exposure pattern 14a on the wafer 14 does not match the mask pattern 12a due to light diffraction and the like and becomes dim as shown in FIG. 16.

Therefore, an OPC is added to the mask pattern 12a to make the exposure pattern 14a more similar to the mask pattern 12a. However, to find the most effective OPC to be added, the following way must be used. The mask 12 is actually fabricated and an OPC is added or corrected according to a result obtained by using it. Then this addition or correction is repeated.

However, fabricating the mask 12 is troublesome. Therefore, with the above simulation-based method, the exposure pattern 14a obtained by transferring the mask pattern 12a formed on the mask 12 onto the wafer 14 is simulated with a computer or the like and an OPC is added or corrected according to the result of the simulation.

Conventionally, the exposure pattern 14a is calculated by performing fast Fourier transform (FFT) on the mask pattern 12a formed on the mask 12. Then an OPC is added to the mask pattern 12a or an OPC added to the mask pattern 12a is corrected so that the exposure pattern 14a will form a desired shape.

By the way, FFT operations involve complex operations, so it takes a long time to perform a process.

Therefore, if the simulation-based method is applied to an entire LSI chip at a high integration level, it will take a very long time to perform a process, resulting in a long development period.

SUMMARY OF THE INVENTION

The present invention was made under the background circumstances as described above. An object of the present invention is to provide an apparatus, method, program, and semiconductor device fabrication method for designing a mask which can shorten mask design time compared with conventional methods.

In order to achieve the above object, an apparatus for designing a mask used for fabricating semiconductor devices is provided. This apparatus for designing a mask comprises a generation unit for generating data regarding a mask pattern formed on a mask from design data regarding an exposure pattern transferred onto a semiconductor substrate, a calculation unit for calculating an exposure pattern transferred onto the semiconductor substrate by applying a filter having a predetermined characteristic to the data regarding a mask pattern generated by the generation unit, and a correction unit for correcting the data regarding a mask pattern generated by the generation unit by comparing the exposure pattern calculated by the calculation unit and the design data.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 6 is a view showing a result obtained by applying the W filter.

DESCRIPTION OF THE PREFERRED EMBODIMENTS

Embodiments of the present invention will now be described with reference to the drawings.

Figure 1:
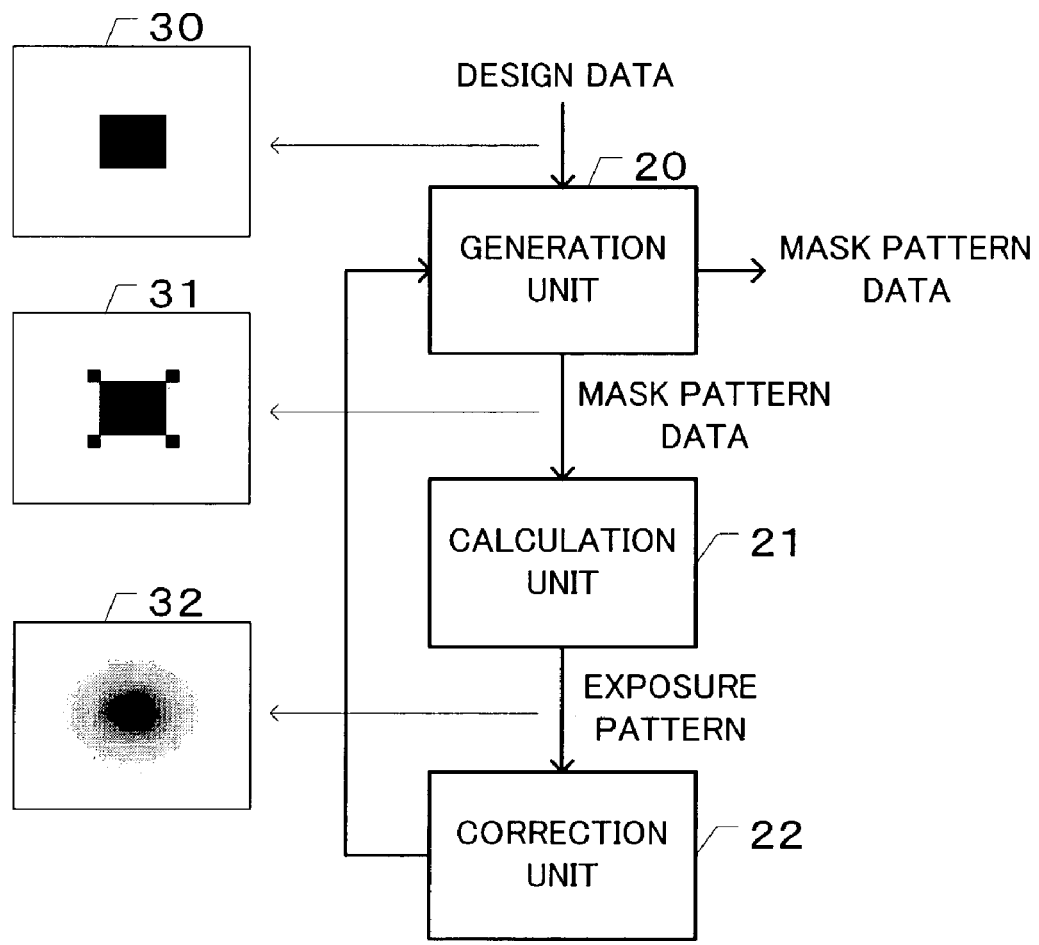
FIG. 1 is a view for describing the principles underlying operation according to the present invention.

FIG. 1 is a view for describing the principles underlying operation according to the present invention. As shown in FIG. 1, an apparatus for designing a mask according to the present invention comprises a generation unit 20, a calculation unit 21, and a correction unit 22.

The generation unit 20 generates data 31 regarding a mask pattern formed on a mask from design data 30 regarding an exposure pattern transferred onto a semiconductor substrate.

The calculation unit 21 calculates an exposure pattern 32 transferred onto a semiconductor substrate by applying a filter having a predetermined characteristic to the data 31 regarding a mask pattern generated by the generation unit 20.

The correction unit 22 corrects the data 31 regarding a mask pattern generated by the generation unit 20 by comparing the exposure pattern 32 calculated by the calculation unit 21 and the design data 30.

Now, operation in FIG. 1 will be described.

It is assumed that the design data 30 indicative of a rectangular pattern shown on the left-hand side of FIG. 1 was input as design data.

Then the generation unit 20 converts the design data 30 into bit map data, puts it into an array, and outputs it to the calculation unit 21 as the data 31 regarding a mask pattern.

The calculation unit 21 calculates the exposure pattern 32 by applying, for example, a two-dimensional filter having a Gaussian distribution characteristic to the data 31 regarding a mask pattern, which was supplied from the generation unit 20 and which was stored in an array and, and outputs it to the correction unit 22.

The correction unit 22 compares the exposure pattern 32 supplied from the calculation unit 21 and the design data 30 and adds an OPC to the data 31 regarding a mask pattern on the basis of a comparison result. By repeating such a process, an optimum mask pattern can be obtained.

Consequently, as shown on the left-hand side of FIG. 1, the obtained data 31 regarding a mask pattern indicates, for example, the original rectangle and four small rectangles (OPC) each added onto its vertex.

As described above, with the apparatus for designing a mask according to the present invention, a two-dimensional filter having a Gaussian distribution characteristic is applied to data regarding a mask pattern to calculate an exposure pattern. As a result, an exposure pattern can be obtained in a short period of time, compared with conventional cases where FFT is used.

Now, a first embodiment of the present invention will be described.

Figure 2:
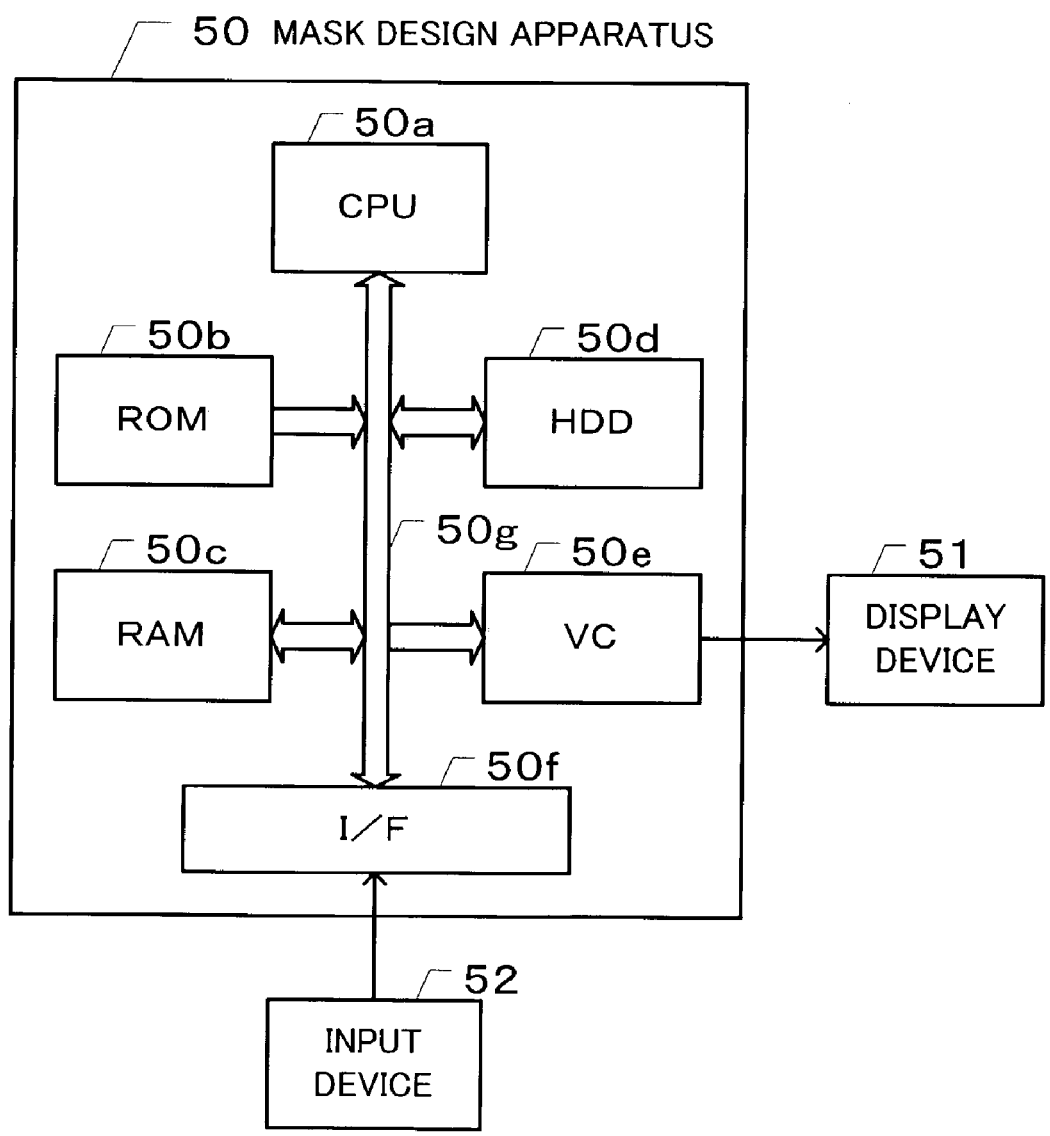
FIG. 2 is a view showing the detailed structure of an apparatus for designing a mask according to the present invention.

FIG. 2 is a view showing the structure of the first embodiment of the present invention. As shown in FIG. 2, an apparatus 50 for designing a mask according to the present invention comprises a central processing unit (CPU) 50a, a read only memory (ROM) 50b, a random access memory (RAM) 50c, a hard disk drive (HDD) 50d, a video card (VC) 50e, an interface (I/F) 50f, and a bus 50g. Moreover, a display device 51 and input device 52 are connected to the outside of the apparatus 50 for designing a mask.

The CPU 50a performs various operation processes on the basis of programs and data stored in the ROM 50b or the HDD 50d and controls each section of the apparatus 50.

The ROM 50b stores basic programs executed by the CPU 50a and data.

The RAM 50c temporarily stores a program which is being executed by the CPU 50a and data on which an operation is being performed.

The HDD 50d stores programs executed by the CPU 50a and data which is being processed or which has been processed.

The VC 50e performs a drawing process in compliance with a drawing instruction from the CPU 50a, converts an obtained image into video signals, and outputs them.

The I/F 50f converts the format of data supplied from the input device 52 so that it will conform to the internal representation format.

The bus 50g connects the CPU 50a, ROM 50b, RAM 50c, HDD 50d, VC 50e, and I/F 50f to one another so that they can exchange data with one another.

The display device 51 includes a cathode ray tube (CRT) monitor, a liquid crystal display (LCD), or the like and displays an image output from the VC 50e.

The input device 52 includes a keyboard, a mouse, or the like. The input device 52 generates data corresponding to operation by a user and outputs it.

Now, an overview of operation in the first embodiment of the present invention will be given with reference to FIG. 3.

Figure 4:
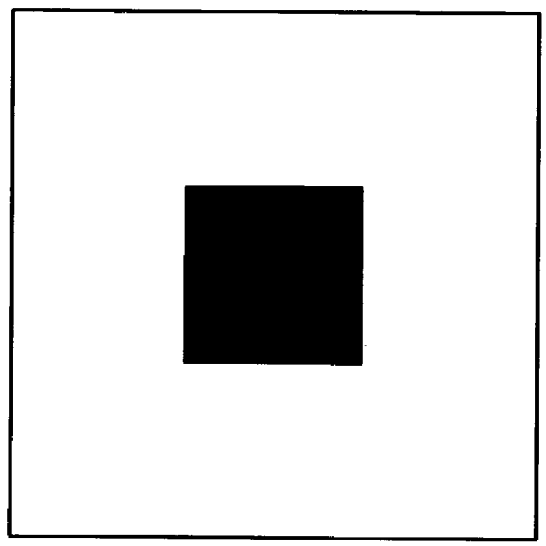
FIG. 4 is a view showing how to express a mask pattern by 0's and 1's.
Figure 4:
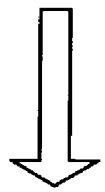

The apparatus 50 for designing a mask according to the present invention generates a mask pattern 60 first on the basis of design data. Then, as shown in FIG. 4, the apparatus 50 for designing a mask converts the obtained mask pattern 60 into a bit map matrix by expressing it by 0's and 1's. In this example, a mask pattern in the middle of which a black rectangle is located is converted into a 6-by-6 bit map matrix.

The apparatus 50 for designing a mask applies a W filter 61, being a two-dimensional filter, which has a Gaussian distribution characteristic to the bit map matrix obtained in this way to calculate an exposure pattern.

Figure 5:
FIG. 5 is a view for describing a process in which a W filter is applied.

To be concrete, the apparatus 50 for designing a mask extracts an area which is the same size as the W filter 61 from the bit map matrix and applies the W filter 61 to the area it extracted from the bit map matrix. It is assumed that the W filter 61 consists of a 3-by-3 element area. Then the apparatus 50 for designing a mask extracts a 3-by-3 element area enclosed by a dashed line in the bit map matrix shown in FIG. 4 and, as shown in FIG. 5, applies the 3-by-3 element W filter 61 to the area.

One method of determining the filter factor of the W filter 61 is as follows. An exposure pattern is obtained by actually performing exposure by the use of a mask pattern having a basic (rectangular, for example) shape. The obtained exposure pattern and an exposure pattern obtained by applying the W filter 61 to a mask pattern having the same shape are compared. The filter factor of the W filter 61 is set so that these exposure patterns will match.

Another method of determining the filter factor of the W filter 61 is as follows. An exposure pattern is obtained by performing FFT which has been used in conventional methods on a mask pattern having a basic shape. The obtained exposure pattern and an exposure pattern obtained by applying the W filter 61 to a mask pattern having the same shape are compared. The filter factor of the W filter 61 is set so that these exposure patterns will match.

In this example, a matrix (the W filter 61) in which all the elements are "⅑" is applied to the extracted 3-by-3 element area. More specifically, by doing a calculation by the use of the following expression, the value of a bit enclosed with a dashed circle shown in FIG. 4 is obtained.

$$R = \sum_{i,j} B_{ij} \times W_{ij} \qquad (1)$$

where $B_{ij}$ indicates the value of an element which is in the ith row and jth column of a bit map matrix, $W_{ij}$ indicates the value of an element which is in the ith row and jth column of a W filter, and R indicates a calculation result (the value of the bit enclosed with the dashed circle shown in FIG. 4).

In the example shown in FIG. 5, the value of a bit in the lower right-hand corner of the extracted area is "1" and the values of the others are "0." By doing a calculation by the use of expression (1), R=⅑ is obtained. Therefore, as shown in FIG. 5, the value of the bit enclosed with the dashed circle is ⅑.

If the values of all $B_{ij}$ in expression (1) are "0," then operations to be performed on that area (calculations to be done by the use of expression (1)) can be omitted. As a result, processing time can be shortened by that much. Moreover, if the values of some $B_{ij}$ are "0," then operations (multiplications) to be performed on these bits can be omitted. As a result, the number of times operations are performed can be reduced by that much.

By doing such calculations on all the bits, calculation results shown in FIG. 6 are obtained. In this example, the values of bits in the central area are great and the value of a bit becomes smaller with the distance from the central area.

Figure 3:
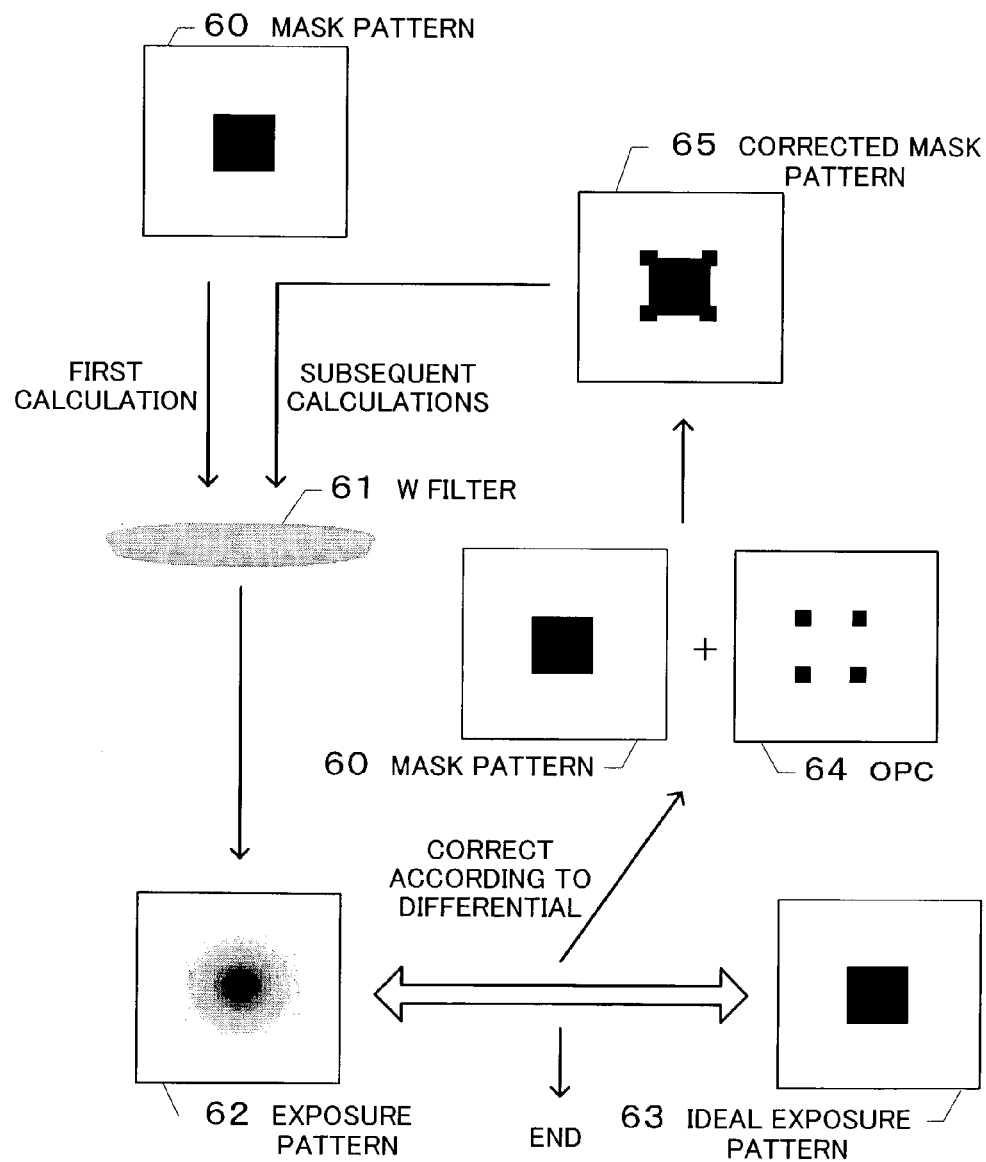
FIG. 3 is a view for giving an overview of a first embodiment of the present invention.
Figure 7:
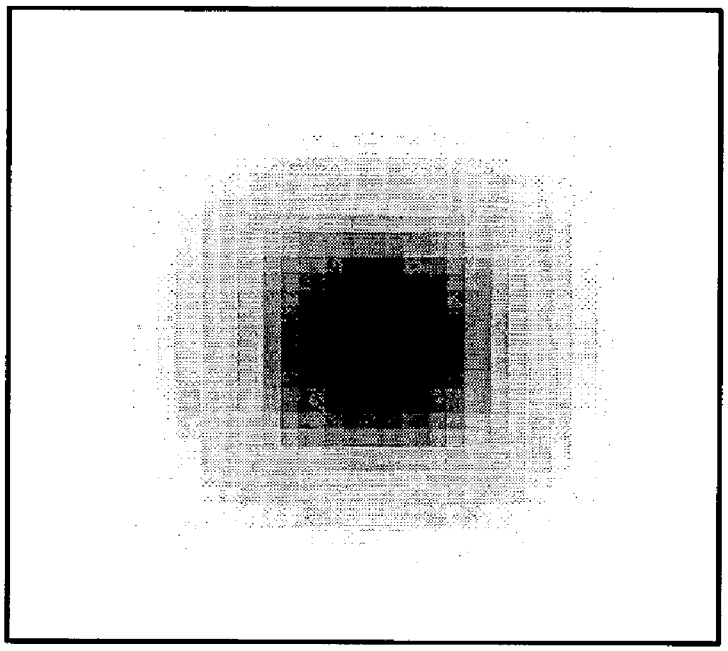
FIG. 7(A) is obtained by displaying the data shown in FIG. 6 as an image.
FIG. 7(B) is obtained by expressing the image shown in FIG. 7(A) by 0's and 1's.
Figure 7:
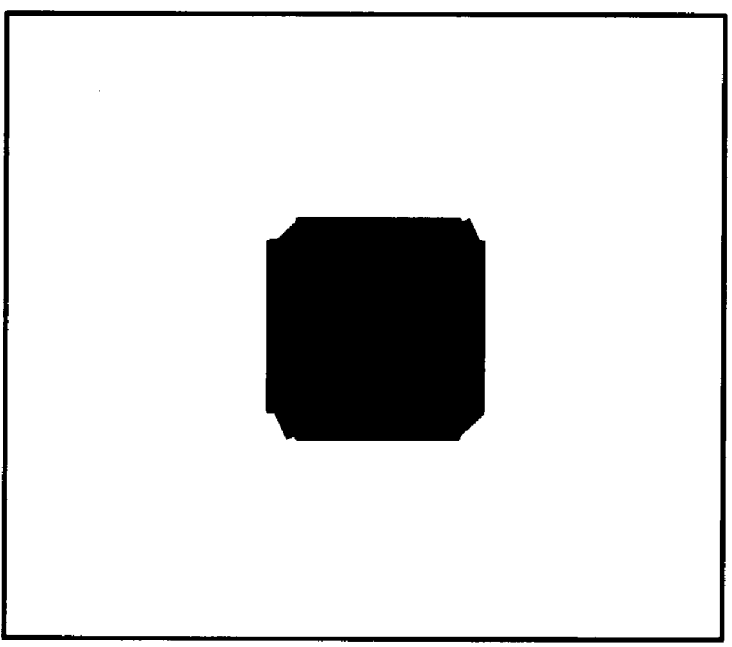

FIG. 7(A) is obtained by displaying the calculation results shown in FIG. 6 as an image and corresponds to the exposure pattern 62 shown in FIG. 3. As shown in FIG. 7(A), the central area of the image obtained by applying the W filter 61 to the mask pattern 60 is dark and peripheral areas are light.

Then the apparatus 50 for designing a mask compares the bit map matrix (exposure pattern 62) showing the calculation results obtained by the use of expression (1) and an ideal exposure pattern 63 (design data), being the ideal shape of an exposure pattern, generates an OPC 64 on the basis of the result of the comparison, and adds it to the mask pattern 60. As a result, a corrected mask pattern 65 is obtained.

The same process that has been described above will be repeated until the difference between the exposure pattern 62 and the ideal exposure pattern 63 falls within a predetermined range. The corrected mask pattern 65 will be used from the second process.

By performing the above processes, an optimum mask pattern data can be obtained.

In the above description, the exposure pattern 62 and the ideal exposure pattern 63 are compared. However, a bit map matrix obtained by expressing the exposure pattern 62 by 0's and 1's with a predetermined value as a threshold and the ideal exposure pattern 63 may be compared. That is to say, it is assumed that a value greater than or equal to ⅔ is expressed as "1" and that a value smaller than ⅔ is expressed as "0." Then the bit map matrix shown in FIG. 7(A) is converted into the one shown in FIG. 7(B). Therefore, the bit map matrix shown in FIG. 7(B) and the ideal exposure pattern 63 are compared. The corrected mask pattern 65 is corrected on the basis of the result of the comparison.

Moreover, in the above description, the W filter 61 is applied to the mask patterns 60 and 65 to obtain exposure patterns. However, a pattern of physical shape formed on a semiconductor substrate may be calculated. In this case, this pattern and design data are compared.

Conventionally, similar operations have been performed by the use of FFT instead of the W filter 61 and proper results have been obtained. However, FFT operations involve complex operations, so it takes a long time to perform them. With the method according to the present invention, there is no need to perform complex operations and therefore calculation time can be shortened.

Figure 8:
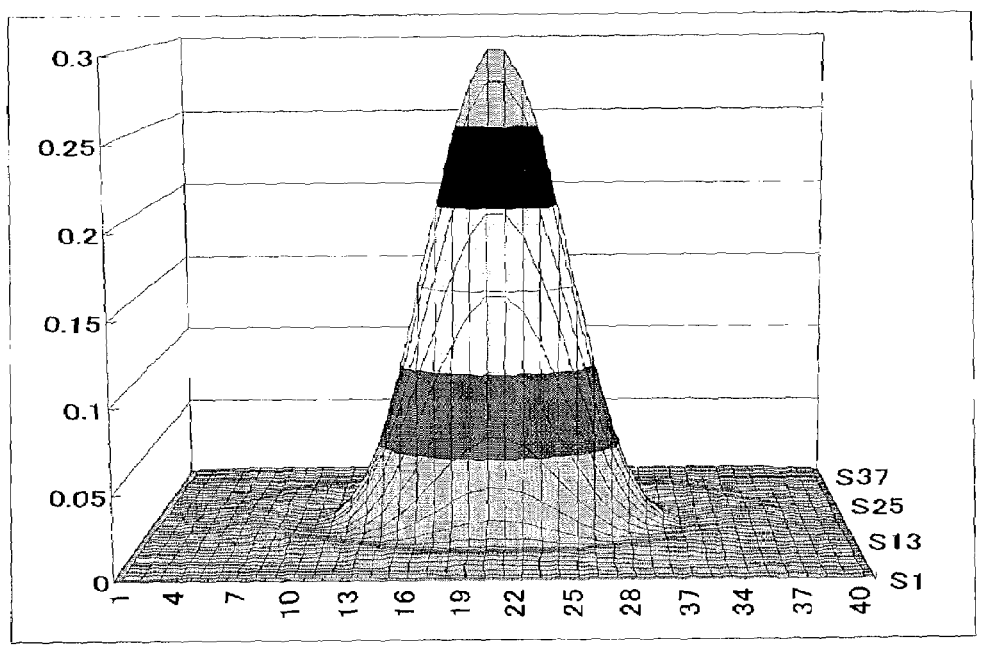
FIG. 8 is a view showing the distribution of light intensity obtained in the case of applying Fourier transform to the mask pattern shown in FIG. 4.
Figure 9:
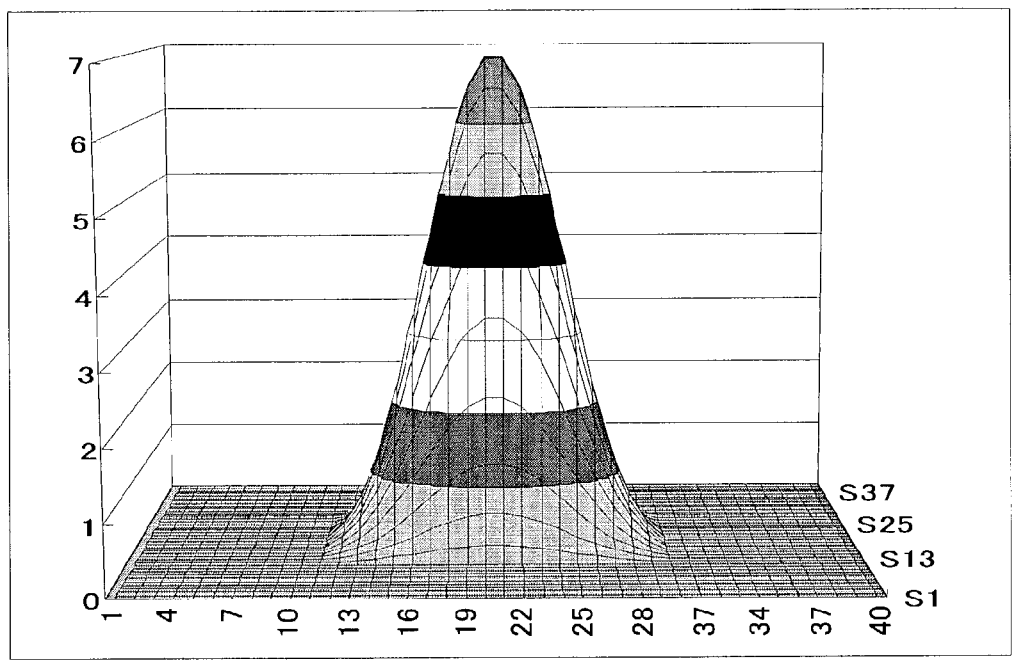
FIG. 9 is a view showing the distribution of light intensity obtained in the case of applying the W filter to the mask pattern shown in FIG. 4.
Figure 10:
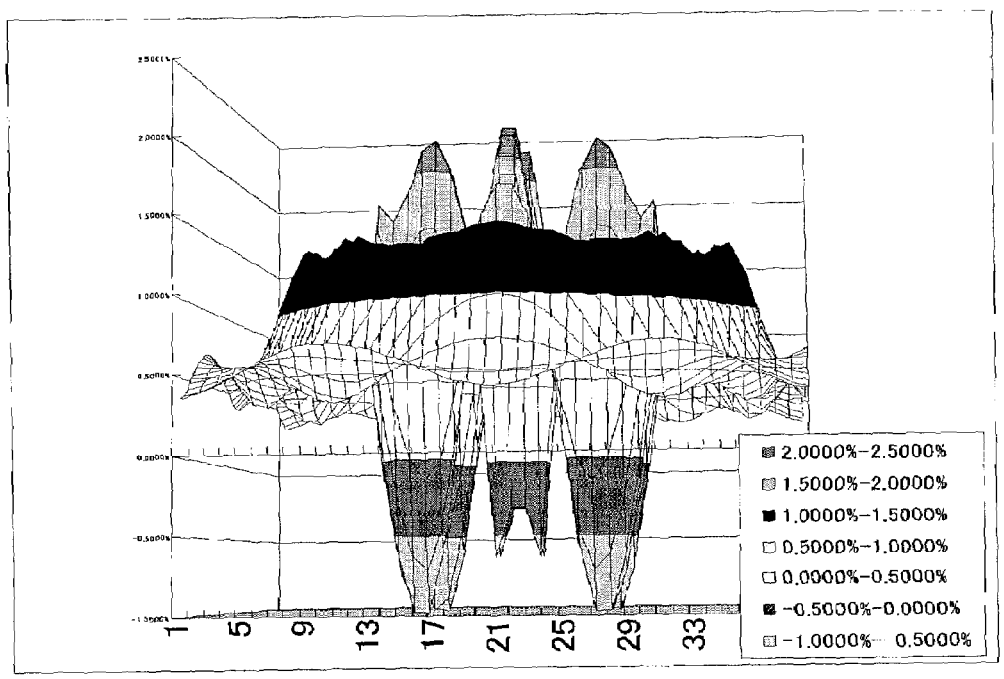
FIG. 10 is a view showing the difference between the graphs shown in FIGS. 8 and 9.

Furthermore, simulations confirmed that calculation errors which occur in the method according to the present invention are smaller than the ones which occur in conventional methods using FFT. FIG. 8 is a view showing results obtained by performing FFT operations on the mask pattern shown in FIG. 4. FIG. 9 is a view showing results obtained by applying the W filter 61 according to the present invention to the mask pattern shown in FIG. 4. FIG. 10 is a view showing the difference between the graphs shown in FIGS. 8 and 9.

The difference shown in FIG. 10 ranges from −1.0% to +2.5% with respect to the z-axis. That is to say, the difference between the graphs shown in FIGS. 8 and 9 falls within a range of from −1.0% to +2.5%. This shows that the same results that are obtained by using FFT can be obtained by applying the W filter 61 according to the present invention.

Figure 11:
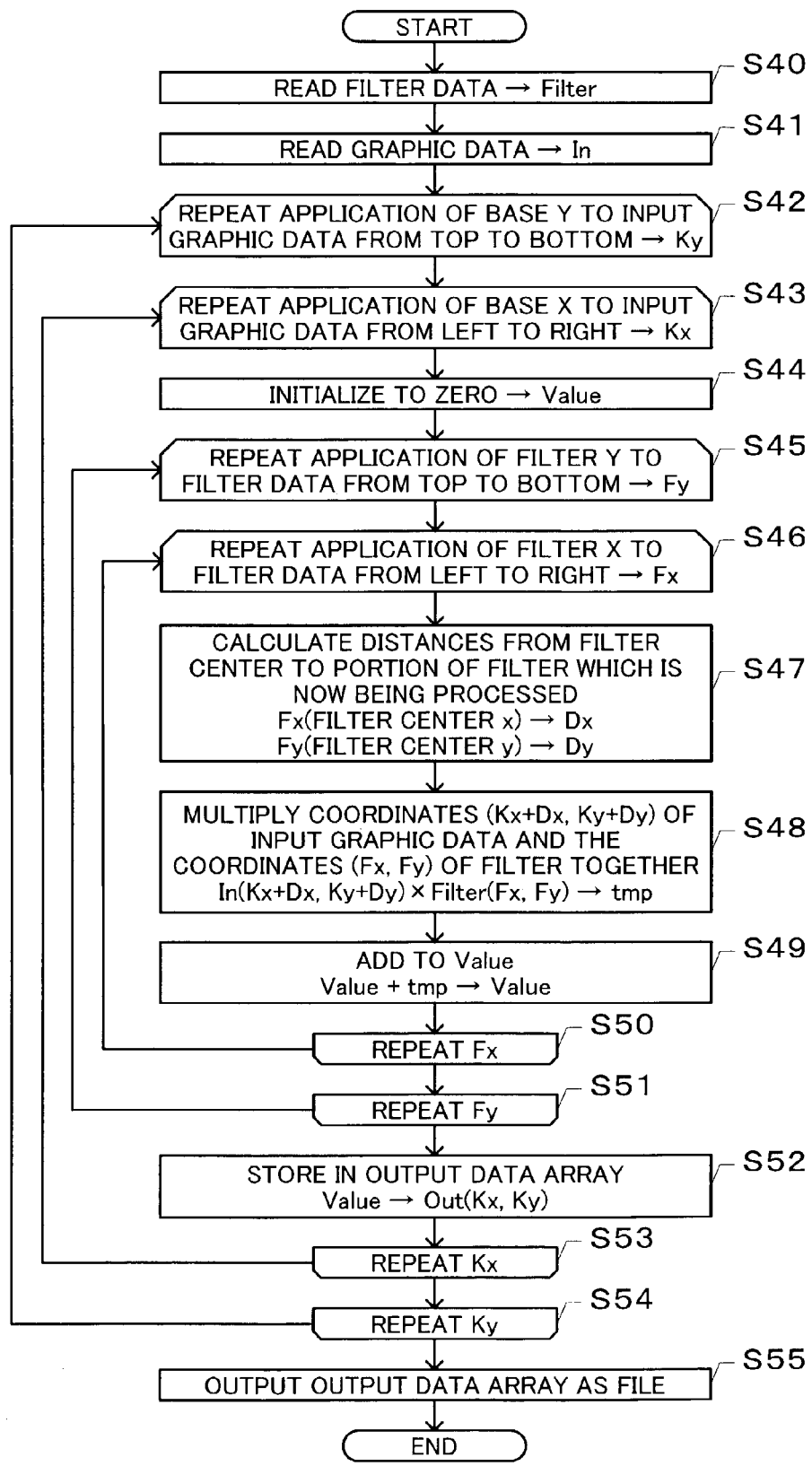
FIG. 11 is a flow chart for describing the flow of a process performed in the first embodiment of the present invention.

Now, the flow of the process of performing operations regarding the W filter 61 will be described with reference to FIG. 11.

[Step S40] The CPU 50a reads data (filter factor) for the W filter 61 from the HDD 50d and stores it in an array Filter.

[Step S41] The CPU 50a reads graphic data (mask pattern data) for the W filter 61 from the HDD 50d and stores it in an array In.

[Step S42] The CPU 50a repeats the application of a base Y to the input graphic from top to bottom. That is to say, the CPU 50a performs a loop process formed by this step and step S54 with Ky as a repeat variable.

[Step S43] The CPU 50a repeats the application of a base X to the input graphic from left to right. That is to say, the CPU 50a performs a loop process formed by this step and step S53 with Kx as a repeat variable.

[Step S44] The CPU 50a initializes a variable Value to zero.

[Step S45] The CPU 50a repeats the application of a filter Y to input filter data from top to bottom. That is to say, the CPU 50a performs a loop process formed by this step and step S51 with Fy as a repeat variable.

[Step S46] The CPU 50a repeats the application of a filter X to the input filter data from left to right. That is to say, the CPU 50a performs a loop process formed by this step and step S50 with Fx as a repeat variable.

[Step S47] The CPU 50a calculates the distances (in the x-axis and y-axis directions) from a filter center (the center of a filter) to a portion of the filter which is now being processed, and substitutes these values for Dx and Dy respectively. For example, if the upper left-hand portion of the area enclosed by the dashed line in FIG. 4 which forms a rectangle is now being processed, then "−1" is substituted both for Dx and Dy.

[Step S48] The CPU 50a multiplies the coordinates (Kx+Dx, Ky+Dy) of the input graphic data and the coordinates (Fx, Fy) of the filter together. That is to say, the CPU 50a calculates In(Kx+Dx, Ky+Dy)×Filter(Fx, Fy) and substitutes an obtained value for a variable tmp.

[Step S49] The CPU 50a accumulatively adds the value of tmp calculated in step S48 to the value of the variable Value.

[Step S50] The CPU 50a repeats Fx.

[Step S51] The CPU 50a repeats Fy. Calculations based on expression (1) will be done by performing steps S45 through S51.

[Step S52] The CPU 50a stores the value of Value calculated by performing the above process in an output data array Out(Kx, Ky).

[Step S53] The CPU 50a repeats Kx.

[Step S54] The CPU 50a repeats Ky.

[Step S55] The CPU 50a outputs the output data array Out(Kx, Ky) to the HDD 50d as a file and makes the HDD 50d store it.

By performing the above process, the process of applying the W filter 61 to the mask pattern 60 and corrected mask pattern 65 can be realized.

Now, a second embodiment of the present invention will be described.

Figure 12:
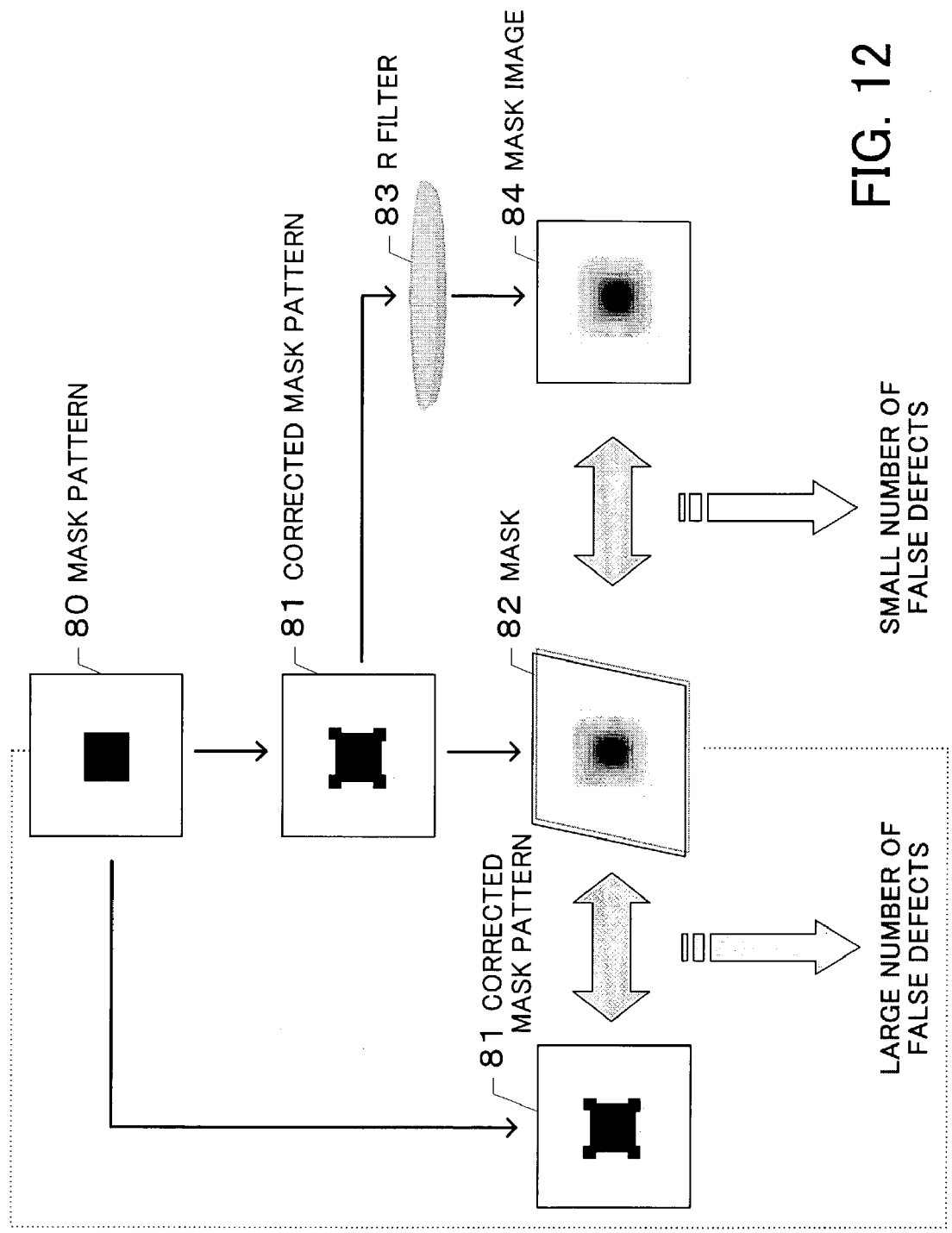
FIG. 12 is a view for giving an overview of a second embodiment of the present invention.

FIG. 12 is a view for giving an overview of a second embodiment of the present invention. In the second embodiment, the flow of a process for detecting a defect in a mask 82 fabricated on the basis of a corrected mask pattern 81 is shown.

An area on the left-hand side of FIG. 12 enclosed by a dashed line shows a conventional method for detecting a defect in a mask. Conventionally, to detect a defect in the mask 82 fabricated on the basis of the corrected mask pattern 81 made by the use of a mask pattern 80, the corrected mask pattern 81 has been used as an object for comparison. The corrected mask pattern 81 and the mask 82 actually fabricated differ greatly in shape, as is seen from FIG. 12. Therefore, many "false defects" will be detected. These false defects are recognized as defects, but actually they are not defects.

Accordingly, in the second embodiment an image of the mask 82 fabricated is simulated by applying an R filter 83 to the corrected mask pattern 81 and an obtained mask image 84 and the mask 82 actually fabricated are compared to detect a defect.

The R filter 83 is a two-dimensional filter having a Gaussian distribution characteristic. This is the same with the W filter 61 shown in FIG. 3. By applying the R filter 83 to the corrected mask pattern 81, a mask image 84 approximate to the mask 82 actually fabricated can be obtained. One method of setting the filter factor of the R filter 83 is as follows. The mask 82 is fabricated by the use of the corrected mask pattern 81 having a basic shape. Then a filter factor is set so that the mask image 84 obtained by applying the R filter 83 will match the mask 82.

Another method of setting the filter factor of the R filter 83 is as follows. The mask image 84 is created by performing FFT which has been used in conventional methods on the corrected mask pattern 81 having a basic shape. Then a filter factor is set so that the mask image 84 obtained by applying the R filter 83 will match the mask image 84 obtained by performing FFT.

As described above, in the second embodiment of the present invention the mask image 84 obtained by applying the R filter 83 to the corrected mask pattern 81 and the mask 82 actually fabricated are compared to detect a defect. This prevents many false defects from being detected, compared with conventional cases where the corrected mask pattern 81 and the mask 82 actually fabricated are compared. As a result, time taken to specify an actual defect from among many false defects detected can be shortened.

Figure 13:
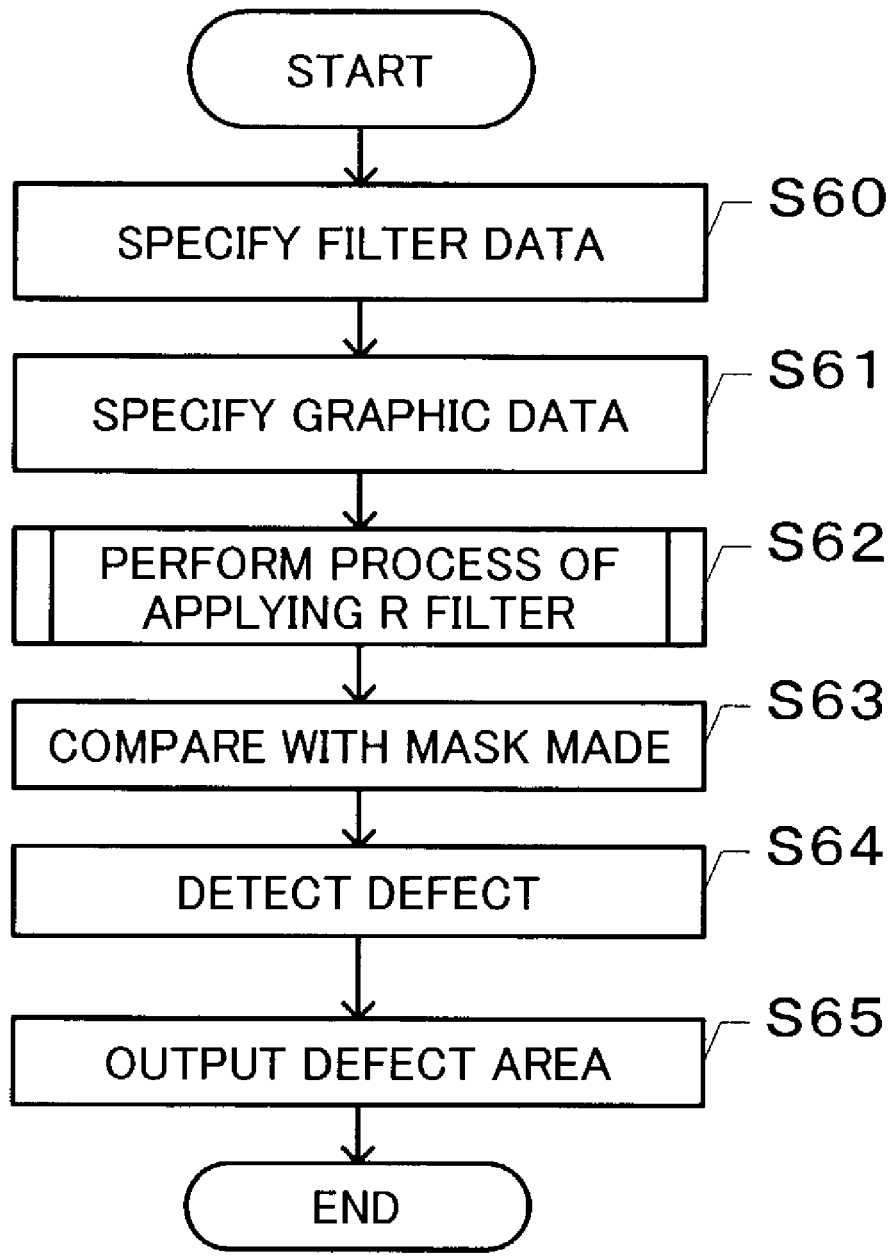
FIG. 13 is a flow chart for describing the flow of a process performed in the second embodiment of the present invention.

FIG. 13 is a flow chart for describing the flow of the above process. The following steps will be performed in compliance with this flow chart.

[Step S60] The CPU 50a specifies filter data, that is to say, data for the R filter 83 stored in the HDD 50d.

[Step S61] The CPU 50a specifies graphic data, that is to say, data for the corrected mask pattern 81 stored in the HDD 50d.

[Step S62] The CPU 50a performs the process of applying the R filter 83 to the corrected mask pattern 81. This process can be realized in compliance with the flow chart shown in FIG. 11.

[Step S63] The CPU 50a compares a pattern image of the mask 82 actually fabricated and the mask image 84 calculated in step S62.

[Step S64] The CPU 50a detects a defect on the basis of the result of the comparison made in step S63.

[Step S65] The CPU 50a generates data indicative of a defect area detected in step S64 and outputs it to the HDD 50d as a file.

As a result of the above process, a result obtained by applying the R filter 83 to the corrected mask pattern 81 and the mask 82 actually fabricated are compared and a defect area can be detected.

Now, a third embodiment of the present invention will be described.

Figure 14:
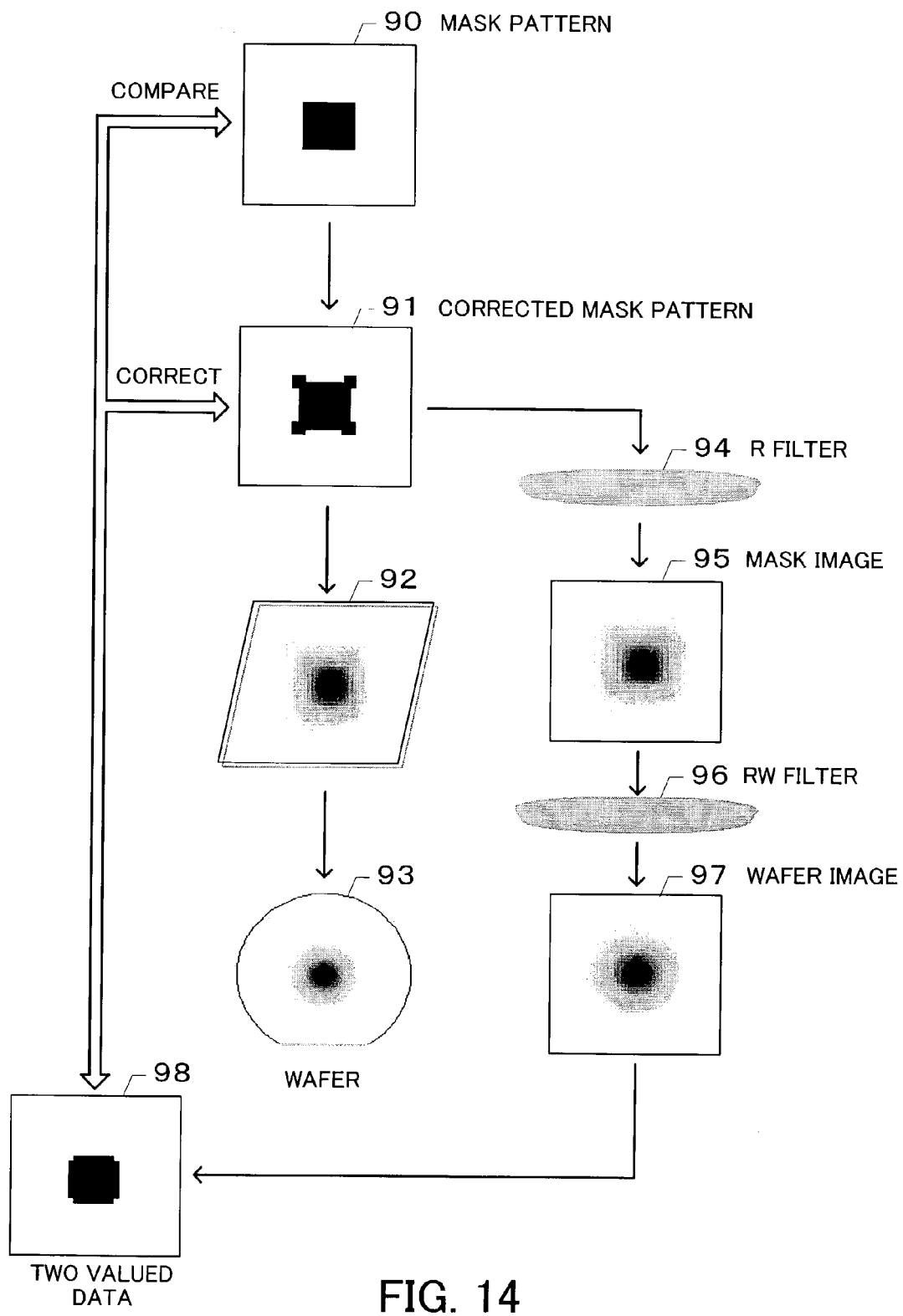
FIG. 14 is a view for giving an overview of a third embodiment of the present invention.

FIG. 14 is a view for giving an overview of a third embodiment of the present invention. In the third embodiment, a more accurate wafer image 97 is produced by the use of an R filter 94 and RW filter 96 so that a wafer 93 actually fabricated will match a mask pattern 90 with high accuracy.

As shown in FIG. 14, in the third embodiment of the present invention a corrected mask pattern 91 is made on the basis of the mask pattern 90 and a mask image 95 is produced by applying the R filter 94 to the corrected mask pattern 91.

The R filter 94 is the same as the R filter 83 used in the above second embodiment and is used for calculating an image of a mask 92 fabricated on the basis of the corrected mask pattern 91. The filter factor of the R filter 94 is optimized by the use of a mask actually fabricated with, for example, a basic pattern. Therefore, the mask image 95 obtained by applying the R filter 94 to the corrected mask pattern 91 also matches with high accuracy the mask 92 actually fabricated.

Then the wafer image 97 indicative of the physical shape of a wafer actually formed is produced by applying the RW filter 96 to the mask image 95. That is to say, the RW filter 96 is for calculating a physical shape formed on a semiconductor substrate on the basis of the mask image 95.

If a circuit pattern is actually formed on a semiconductor substrate by the use of an image of a mask on which a basic figure is formed, the filter factor of the RW filter 96 can be calculated from the relations between the image of the mask and a physical shape actually formed. The RW filter 96 is basically a two-dimensional filter having a Gaussian distribution characteristic. This is the same with the R and W filters.

Another method of finding the filter factor of the RW filter 96 is to determine it so that a circuit pattern obtained by performing FFT on an image of a mask on which a basic figure is formed will match a circuit pattern obtained by applying the RW filter 96 to an image of the same mask on which the basic figure is formed.

As stated above, the R filter 94 and the RW filter 96 are used to produce the wafer image 97. Two valued data 98 obtained by expressing the wafer image 97 by 0's and 1's with a predetermined value as a threshold and the mask pattern 90 are compared. If there is an error between the two valued data 98 and the mask pattern 90, then the corrected mask pattern 91 is corrected at need. By repeating the same process by the use of the corrected mask pattern 91 corrected, the highly accurate corrected mask pattern 91 or mask 92 can be made.

As described above, in the third embodiment of the present invention two different filters, that is to say, the R filter 94 and the RW filter 96 are used for calculating the wafer image 97 produced by the corrected mask pattern 91 and the mask pattern 90 or the corrected mask pattern 91 is corrected on the basis of the result of the calculation. The highly accurate corrected mask pattern 91 therefore can be made.

In the above embodiment, the RW filter 96 is used for obtaining the wafer image 97 having a physical shape from the mask image 95. However, the mask pattern 90 or the corrected mask pattern 91 may be corrected on the basis of an exposure pattern calculated.

Moreover, another filter may be made by combining the filter factors of the R filter 94 and the RW filter 96. By doing so, the number of times a filter is applied can be reduced from two to one.

Figure 15:
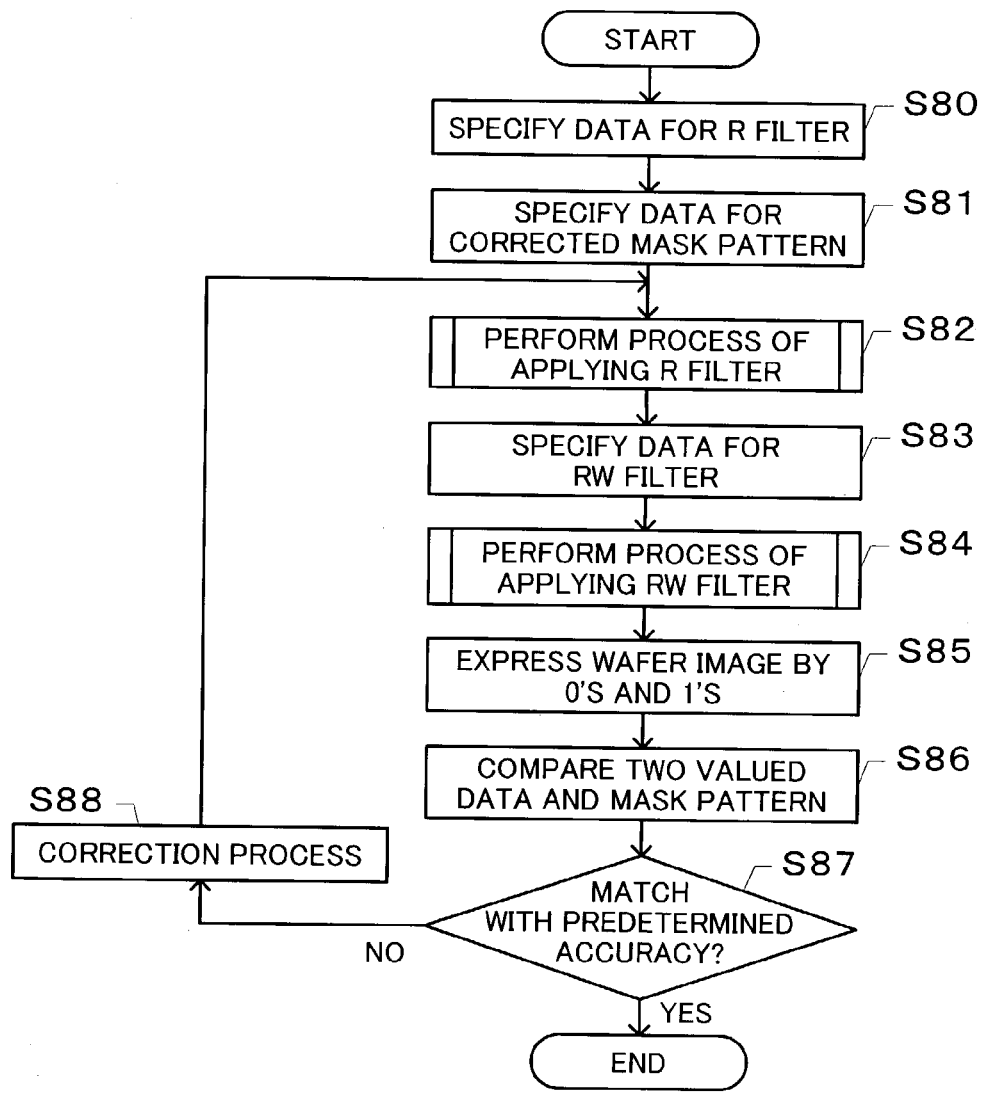
FIG. 15 is a flow chart for describing the flow of a process performed in the third embodiment of the present invention.
Figure 16:
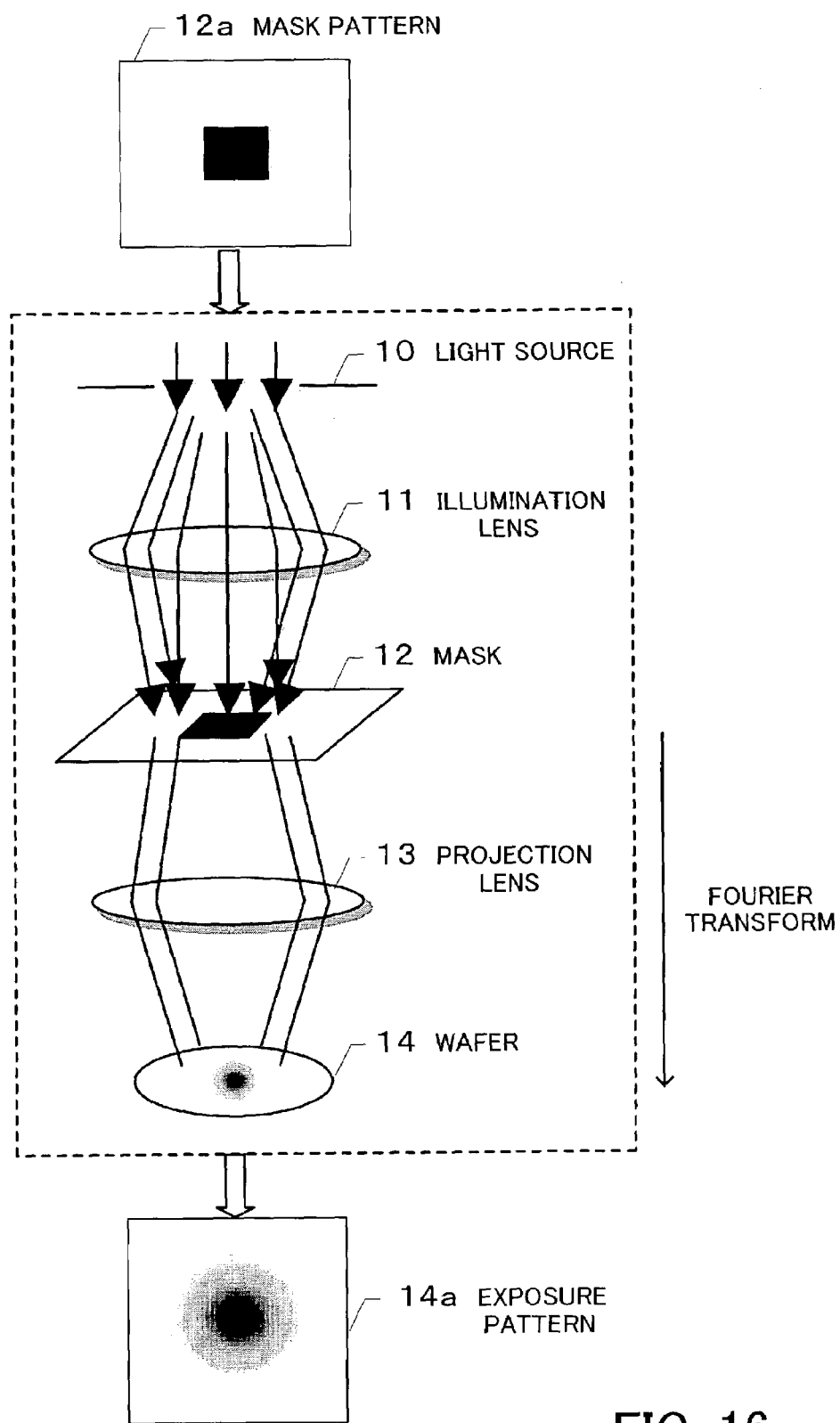
FIG. 16 is a view for describing a way of adding an OPC in a conventional simulation-based method.

FIG. 15 is a flow chart for describing the flow of the above process. The following steps will be performed in compliance with this flow chart.

[Step S80] The CPU 50a specifies data for the R filter 94 stored in the HDD 50d.

[Step S81] The CPU 50a specifies data for the corrected mask pattern 91 stored in the HDD 50d.

[Step S82] The CPU 50a performs the process of applying the R filter 94 to the corrected mask pattern 91 (or mask pattern 90). This process can be realized in compliance with the flow chart shown in FIG. 11.

[Step S83] The CPU 50a specifies data for the RW filter 96 stored in the HDD 50d.

[Step S84] The CPU 50a performs the process of applying the RW filter 96 to the mask image 95 obtained in step S82. This process can also be realized in compliance with the flow chart shown in FIG. 11.

[Step S85] The CPU 50a expresses the wafer image 97 obtained in step S84 by 0's and 1's with a predetermined value as a threshold.

[Step S86] The CPU 50a compares the two valued data 98 obtained in step S85 and the mask pattern 90.

[Step S87] The CPU 50a judges on the basis of the result of the comparison made in step S86 whether the two valued data 98 and the mask pattern 90 match with predetermined accuracy. If they match with the predetermined accuracy, then the CPU 50a terminates the process. If they do not match with the predetermined accuracy, then the CPU 50a performs step S88.

[Step S88] On the basis of the result of the comparison made in step S86, the CPU 50a corrects the corrected mask pattern 91 by adding an OPC to the corrected mask pattern 91 or by correcting an OPC which has already been added.

By performing the above process, the wafer image 97 can be calculated with high accuracy by the use of two filters, that is to say, by the use of the R filter 94 and the RW filter 96.

Performing an exposure process by the use of a wafer fabricated in this way can make a physical shape actually formed on a semiconductor substrate match design data with high accuracy, resulting in higher reliability and the like of a semiconductor device.

In the first through third embodiments the descriptions have been given with a case where a mask is designed as an example. However, it is a matter of course that the present invention is also applicable to a case where a reticle is designed.

The above processing functions can be realized with a computer. In that case, a program in which the contents of the functions the apparatus for designing a mask should have are described is provided. By executing this program on a computer, the above functions are realized on the computer. This program can be recorded on a computer readable record medium. A computer readable record medium can be a magnetic recording device, an optical disk, a magneto-optical recording medium, a semiconductor memory, or the like. A magnetic recording device can be a hard disk drive (HDD), a flexible disk (FD), a magnetic tape, or the like. An optical disk can be a digital versatile disc (DVD), a digital versatile disc random access memory (DVD-RAM), a compact disc read only memory (CD-ROM), a compact disc recordable (CD-R)/rewritable (CD-RW), or the like. A magneto-optical recording medium can be a magneto-optical disc (MO) or the like.

To place the program on the market, portable record media, such as DVDs or CD-ROMs, on which it is recorded are sold. Alternatively, the program is stored in advance on a hard disk in a server computer and is transferred to another computer via a network.

When a computer executes this program, it will store the program, which is recorded on a portable record medium or which is transferred from a server computer, on, for example, its hard disk. Then it reads the program from its hard disk and performs processes in compliance with the program. A computer can also read the program directly from a portable record medium and perform processes in compliance with the program. Furthermore, each time the program is transferred from a server computer, a computer can perform processes in turn in compliance with the program it received.

As has been described in the foregoing, with the apparatus for designing a mask used for fabricating semiconductor devices, according to the present invention, an exposure pattern transferred onto a semiconductor substrate is calculated by applying a filter having a predetermined characteristic to mask pattern data and the mask pattern data is corrected by comparing the exposure pattern calculated and design data. Therefore, processing time can be shortened, compared with a case where FFT is used for design.

Moreover, with the apparatus for designing a mask used for fabricating semiconductor devices, according to the present invention, a pattern of physical shape formed on a semiconductor substrate is calculated by applying a filter having a predetermined characteristic to mask pattern data and the mask pattern data is corrected by comparing the pattern of physical shape calculated and design data. Therefore, processing time can be shortened and the accuracy of design can be improved, compared with a case where FFT is used for design.

Furthermore, with the apparatus for designing a mask used for fabricating semiconductor devices, according to the present invention, a pattern of physical shape on a mask actually made is calculated by applying a filter having a predetermined characteristic to mask pattern data and whether or not there is a defect is judged by comparing the pattern of physical shape calculated and a pattern of physical shape on the mask actually made. This prevents many false defects from being detected.

In addition, with the apparatus for designing a mask used for fabricating semiconductor devices, according to the present invention, a pattern of physical shape on a mask actually made is calculated by applying a first filter having a predetermined characteristic to mask pattern data, an exposure pattern obtained by performing exposure by the use of the calculated mask or a pattern of physical shape formed on a semiconductor substrate by the use of the calculated mask is calculated by applying a second filter to the mask pattern data, and the mask pattern data is corrected by comparing the calculated exposure pattern or pattern of physical shape and design data. The accuracy of design therefore can be improved.

Moreover, with the method for fabricating semiconductor devices by the use of a mask, according to the present invention, an exposure pattern transferred onto a semiconductor substrate or a pattern of physical shape formed on the semiconductor substrate is calculated by applying a filter having a predetermined characteristic to mask pattern data, the mask pattern data is corrected by comparing the calculated exposure pattern or pattern of physical shape and design data, and exposure is performed by the use of a corrected mask. Therefore, highly accurate semiconductor devices can be developed in a short period of time.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An apparatus for designing a mask used for fabricating semiconductor devices, the apparatus comprising:

a generation unit for generating a data regarding a mask pattern formed on a mask from design data regarding the exposure pattern transferred onto a semiconductor substrate;

a calculation unit for calculating an exposure pattern transferred onto the semiconductor substrate by applying a filter having a predetermined characteristic to the data regarding the mask pattern generated by the generation unit, wherein the filter is a two-dimensional filter having a Gaussian distribution characteristic; and a correction unit for applying optical proximity corrections to the data regarding the mask pattern generated by the generation unit if a difference between the exposure pattern and the design data does not fall within a predetermined range.

2. The apparatus for designing a mask according to claim 1, wherein a factor of the two-dimensional filter is determined on the basis of a result obtained by performing Fourier transform on the mask pattern.

3. The apparatus for designing a mask according to claim 1, wherein the factor of the two-dimensional filter is determined on the basis of correspondence between predetermined mask pattern data and an exposure pattern obtained by transferring the mask pattern data onto the semiconductor substrate.

4. A method for designing a mask used for fabricating semiconductor devices, the method comprising:

for generating data regarding a mask pattern formed on a mask from design a data regarding an exposure pattern transferred onto a semiconductor substrate;

for calculating the exposure pattern transferred onto the semiconductor substrate by applying a filter having a predetermined characteristic to the data regarding the mask pattern generated in the generation step, wherein the filter is a two-dimensional filter having a Gaussian distribution characteristic; and for correcting by applying optical proximity corrections to the data regarding the mask pattern generated in the generation step if a difference between the exposure pattern and the design data does not fall within a predetermined range.

5. A program for making a computer perform the process of designing a mask used for fabricating semiconductor devices, the program making the computer function as:

a generation unit for generating a data regarding a mask pattern formed on a mask from design data regarding an exposure pattern transferred onto a semiconductor substrate;

a calculation unit for calculating the exposure pattern transferred onto the semiconductor substrate by applying a filter having a predetermined characteristic to the data regarding the mask pattern generated by the generation unit, wherein the filter is a two-dimensional filter having a Gaussian distribution characteristic; and a correction unit for apply optical proximity corrections to the data regarding the mask pattern generated by the generation unit if a difference between the exposure pattern and the design data does not fall within a predetermined range.

6. An apparatus for designing a mask used for fabricating semiconductor devices, the apparatus comprising:

a generation unit for generating a data regarding a mask pattern formed on a mask from design data regarding an exposure pattern transferred onto a semiconductor substrate;

a calculation unit for calculating a pattern of physical shape formed on the semiconductor substrate by applying a filter having a predetermined characteristic to the data regarding a mask pattern generated by the generation unit, wherein the filter is a two-dimensional filter having a Gaussian distribution characteristic; and a correction unit for applying optical proximity corrections to the data regarding the mask pattern generated by the generation unit if a difference between the exposure pattern and the design data does not fall within a predetermined range.

7. The apparatus for designing a mask according to claim 6, wherein a factor of the two-dimensional filter is determined on the basis of a result obtained by performing Fourier transform on the mask pattern.

8. The apparatus for designing a mask according to claim 6, wherein the factor of the two-dimensional filter is determined on the basis of correspondence between predetermined mask pattern data and a pattern of physical shape obtained by transferring the mask pattern data onto the semiconductor substrate and by etching the semiconductor substrate.

9. A method for designing a mask used for fabricating semiconductor devices, the method comprising:

generating a data regarding a mask pattern formed on a mask from design data regarding an exposure pattern transferred onto a semiconductor substrate;

calculating a pattern of physical shape formed on the semiconductor substrate by applying a filter having a predetermined characteristic to the data regarding a mask pattern generated in the generation step, wherein the filter is a two-dimensional filter having a Gaussian distribution characteristic; and correcting by applying optical proximity corrections to the data regarding the mask pattern generated in the generation step if a difference between the exposure pattern and the design data does not fall within a predetermined range.

10. A program for making a computer perform the process of designing a mask used for fabricating semiconductor devices, the program making the computer function as:

a generation unit for generating a data regarding a mask pattern formed on a mask from design data regarding an exposure pattern transferred onto a semiconductor substrate;

a calculation unit for calculating a pattern of physical shape formed on the semiconductor substrate by applying a filter having a predetermined characteristic to the data regarding the mask pattern generated by the generation unit, wherein the filter is a two-dimensional filter having a Gaussian distribution characteristic; and a correction unit for applying optical proximity corrections to the data regarding the mask pattern generated by the generation unit if a difference between the exposure pattern and the design data does not fall within a predetermined range.

11. An apparatus for designing a mask used for fabricating semiconductor devices, the apparatus comprising:

a generation unit for generating a data regarding a mask pattern formed on a mask from design data regarding an exposure pattern transferred onto a semiconductor substrate;

a calculation unit for calculating a pattern of physical shape on the mask actually made by applying a filter having a predetermined characteristic to the data regarding a mask pattern generated by the generation unit and for determining optical proximity corrections, wherein the filter is a two-dimensional filter having a Gaussian distribution characteristic; and a judgment unit for judging by comparing the pattern of physical shape on the mask calculated by the calculation unit and the pattern of physical shape on the mask actually made whether there is a defect.

12. The apparatus for designing a mask according to claim 11, wherein a factor of the two-dimensional filter is determined on the basis of a result obtained by performing Fourier transform on the mask pattern.

13. The apparatus for designing a mask according to claim 11, wherein the factor of the two-dimensional filter is determined on the basis of correspondence between predetermined mask pattern data and a pattern of physical shape on a mask actually made on the basis of the mask pattern data.

14. A method for designing a mask used for fabricating semiconductor devices, the method comprising:

generating a data regarding a mask pattern formed on a mask from design data regarding an exposure pattern transferred onto a semiconductor substrate;

calculating a pattern of physical shape on a mask actually made by applying a filter having a predetermined characteristic to the data regarding the mask pattern generated in the generation step, wherein the filter is a two-dimensional filter having a Gaussian distribution characteristic;

determining optical proximity corrections; and judging by comparing the pattern of physical shape on a mask calculated in the calculation step and a pattern of physical shape on a mask actually made whether there is a defect.

15. A program for making a computer perform the process of designing a mask used for fabricating semiconductor devices, the program making the computer function as:

a generation unit for generating data regarding a mask pattern formed on a mask from design data regarding an exposure pattern transferred onto a semiconductor substrate;

a calculation unit for calculating a pattern of physical shape on a mask actually made by applying a filter having a predetermined characteristic to the data regarding a mask pattern generated by the generation unit and for determining optical proximity corrections, wherein the filter is a two-dimensional filter having a Gaussian distribution characteristic; and a judgment unit for judging by comparing the pattern of physical shape on a mask calculated by the calculation unit and a pattern of physical shape on a mask actually made whether there is a defect.

16. An apparatus for designing a mask used for fabricating semiconductor devices, the apparatus comprising:

a generation unit for generating data regarding a mask pattern formed on a mask from design data regarding an exposure pattern transferred onto a semiconductor substrate;

a first calculation unit for calculating a pattern of physical shape on a mask actually made by applying a first filter having a predetermined characteristic to the data regarding a mask pattern generated by the generation unit;

a second calculation unit for calculating an exposure pattern obtained by performing exposure by the use of the mask calculated by the first calculation unit or a pattern of physical shape formed on the semiconductor substrate by the use of the mask calculated by the first calculation unit, by applying a second filter to the data regarding a mask pattern, wherein the first filter and the second filter are two-dimensional filters each having a Gaussian distribution characteristic; and a correction unit for applying optical proximity corrections to the data regarding a mask pattern generated by the generation unit if difference between the exposure pattern and the design data does not fall within a predetermined range.

17. The apparatus for designing a mask according to claim 16, wherein:

a factor of the first filter is determined on the basis of a result obtained by performing Fourier transform on the data regarding a mask pattern; and a factor of the second filter is determined on the basis of a result obtained by performing Fourier transform on the result of a calculation done by the first calculation unit.

18. The apparatus for designing a mask according to claim 16, wherein:

the factor of the first filter is determined on the basis of correspondence between predetermined mask pattern data and a pattern of physical shape on a mask actually made on the basis of the mask pattern data; and the factor of the second filter is determined on the basis of correspondence between the pattern of physical shape and an exposure pattern obtained by performing exposure by the use of a mask on which the pattern of physical shape is formed or a pattern of physical shape formed on the semiconductor substrate by the use of a mask on which the pattern of physical shape is formed.

19. A method for designing a mask used for fabricating semiconductor devices, the method comprising:

generating data regarding a mask pattern formed on a mask from design data regarding an exposure pattern transferred onto a semiconductor substrate;

calculating a pattern of physical shape on a mask actually made by applying a first filter having a predetermined characteristic to the data regarding a mask pattern generated in the generation step;

calculating an exposure pattern obtained by performing exposure by the use of the mask calculated in the first calculation step or a pattern of physical shape formed on the semiconductor substrate by the use of the mask calculated in the first calculation step, by applying a second filter to the data regarding a mask pattern, wherein the first filter and the second filter are two-dimensional filters each having a Gaussian distribution characteristic; and correcting by applying optical proximity corrections to the data regarding a mask pattern generated in the generation step if difference between the exposure pattern and the design data does not fall within a predetermined range.

20. A program for making a computer perform the process of designing a mask used for fabricating semiconductor devices, the program making the computer function as:

a generation unit for generating data regarding a mask pattern formed on a mask from design data regarding an exposure pattern transferred onto a semiconductor substrate;

a first calculation unit for calculating a pattern of physical shape on a mask actually made by applying a first filter having a predetermined characteristic to the data regarding a mask pattern generated by the generation unit;

a second calculation unit for calculating an exposure pattern obtained by performing exposure by the use of the mask calculated by the first calculation unit or a pattern of physical shape formed on the semiconductor substrate by the use of the mask calculated by the first calculation unit, by applying a second filter to the data regarding a mask pattern, wherein the first filter and the second filter are two-dimensional filters each having a Gaussian distribution characteristic; and a correction unit for applying optical proximity corrections to the data regarding a mask pattern generated by the generation unit if difference between the exposure pattern and the design data does not fall within a predetermined range.

21. A method for fabricating semiconductor devices by the use of a mask, the method comprising:

generating a data regarding a mask pattern formed on a mask from design data regarding an exposure pattern transferred onto a semiconductor substrate;

calculating the exposure pattern transferred onto the semiconductor substrate or a pattern of physical shape formed on the semiconductor substrate by applying a filter having a predetermined characteristic to the data regarding the mask pattern generated in the generation step, wherein the filter is a two-dimensional filter having a Gaussian distribution characteristic;

correcting by applying optical proximity corrections to the data regarding the mask pattern generated in the generation step if difference between the exposure pattern and the design data does not fall within a predetermined range; and performing exposure by the use of a mask corrected in the correction step.

* * * * *

UNITED STATES PATENT AND TRADEMARK OFFICE
CERTIFICATE OF CORRECTION

PATENT NO. : 7,039,889 B2
APPLICATION NO. : 10/379904
DATED : May 2, 2006
INVENTOR(S) : Kazuhiko Takahashi et al.

Page 1 of 1

It is certified that error appears in the above-identified patent and that said Letters Patent is hereby corrected as shown below:

Column 12, line 3, change "the exposure" to --an exposure--;
          line 5, change "an exposure" to --the exposure--;
          line 28, change "data" to --a data--; and
          line 29, change "design a" to --design--.
Column 13, line 28, change "regarding a" to --regarding the--;
          line 62, change "the mask" to --a mask--; and
          line 64, change "a mask" to --the mask--.
Column 14, line 27, change "shape on a" to --shape on the--;
          line 28, change "a pattern" to --the pattern--;
          line 29, change "a mask" to --the mask--;
          line 34, change "generating" to --generating a--;
          line 41, change "a mask" to --the mask--;
          line 46, change "a mask" to --the mask--;
          line 47, change "a pattern" to --the pattern-- and change "a mask" to --the mask--;
          line 51, change "generating" to --generating a--;
          line 58, change "a mask" to --the mask--; and
          line 62, change "the mask" to --a mask--.
Column 15, line 4, change "a mask" to --the mask--;
          line 32, change "generating" to --generating a--;
          line 37, change "a mask" to --the mask--;
          line 41, change "a pattern" to --the pattern--; and
          line 49, change "a mask" to --the mask--.
Column 16, line 4, change "generating data" to --generating a data--;
          line 11, change "regarding a mask" to --regarding the mask--; and
          line 23, change "regarding a mask" to --regarding the mask--.

Signed and Sealed this

Eighth Day of August, 2006

JON W. DUDAS
*Director of the United States Patent and Trademark Office*